(12) United States Patent
Becker et al.

(10) Patent No.: US 8,288,080 B2
(45) Date of Patent: Oct. 16, 2012

(54) PHOTOPOLYMERIZABLE FLEXOGRAPHIC PRINTING ELEMENTS AND HARD FLEXOGRAPHIC PRINTING FORMES WHICH ARE PRODUCED THEREFROM

(75) Inventors: Armin Becker, Großniedesheim (DE); Uwe Stebani, Flörsheim-Dalsheim (DE); Berthold Geisen, Stuttgart (DE); Uwe Krauss, Goßersweiler-Stein (DE); Thomas Telser, Heidelberg-Wieblingen (DE)

(73) Assignee: Flint Group Germany GmbH, Stuttgart (DE)

( * ) Notice: Subject to any disclaimer, the term of this patent is extended or adjusted under 35 U.S.C. 154(b) by 318 days.

(21) Appl. No.: 12/526,443

(22) PCT Filed: Feb. 8, 2008

(86) PCT No.: PCT/EP2008/051534
§ 371 (c)(1),
(2), (4) Date: Mar. 15, 2010

(87) PCT Pub. No.: WO2008/095994
PCT Pub. Date: Aug. 14, 2008

(65) Prior Publication Data
US 2010/0297558 A1    Nov. 25, 2010

(30) Foreign Application Priority Data
Feb. 8, 2007 (DE) .......... 10 2007 006 378

(51) Int. Cl.
G03F 7/24 (2006.01)
G03F 7/11 (2006.01)
B32B 37/00 (2006.01)
B41C 1/05 (2006.01)

(52) U.S. Cl. ........ 430/287.1; 430/285.1; 430/286.1; 430/306; 430/300; 430/271.1; 430/270.1; 430/273.1

(58) Field of Classification Search .......... None
See application file for complete search history.

(56) References Cited

U.S. PATENT DOCUMENTS

| 3,264,103 | A | | 8/1966 | Cohen et al. | |
|---|---|---|---|---|---|
| 4,045,231 | A | * | 8/1977 | Toda et al. | 430/286.1 |
| 4,994,344 | A | * | 2/1991 | Kurtz et al. | 430/273.1 |
| 5,175,072 | A | | 12/1992 | Martens | |
| 5,176,986 | A | | 1/1993 | Telser et al. | |
| 7,105,206 | B1 | | 9/2006 | Beck et al. | |
| 2006/0115602 | A1 | | 6/2006 | Beck et al. | |
| 2006/0249239 | A1 | | 11/2006 | Krauss et al. | |
| 2008/0061036 | A1 | | 3/2008 | Schadebrodt et al. | |
| 2008/0257185 | A1 | | 10/2008 | Becker et al. | |
| 2009/0068593 | A1 | * | 3/2009 | Fujiwara et al. | 430/286.1 |

FOREIGN PATENT DOCUMENTS

| EP | 1069475 A1 | 1/2001 |
|---|---|---|
| EP | 1070989 A1 | 1/2001 |
| EP | 1072953 A1 | 1/2001 |
| EP | 1158365 A1 | 11/2001 |
| EP | 1516745 A1 | 3/2005 |
| WO | WO-90/11344 A1 | 10/1990 |
| WO | WO-94/03838 A1 | 2/1994 |
| WO | WO-9614603 A1 | 5/1996 |
| WO | WO-01/39897 A2 | 6/2001 |
| WO | WO-01/88615 A1 | 11/2001 |
| WO | WO-2004/092841 A2 | 10/2004 |
| WO | WO-2005/113240 A1 | 12/2005 |
| WO | WO-2006/056413 A2 | 6/2006 |
| WO | WO-2006/120935-A1 * | 11/2006 |

* cited by examiner

*Primary Examiner* — Cynthia Hamilton
(74) *Attorney, Agent, or Firm* — Connolly Bove Lodge & Hutz LLP

(57) ABSTRACT

The invention relates to photopolymerizable flexographic printing elements which contain ethylenically unsaturated, alicyclic monomers and hard flexographic printing plates, in particular cylindrical continuous seamless flexographic printing plates, which can be produced therefrom.

16 Claims, No Drawings

PHOTOPOLYMERIZABLE FLEXOGRAPHIC PRINTING ELEMENTS AND HARD FLEXOGRAPHIC PRINTING FORMES WHICH ARE PRODUCED THEREFROM

RELATED APPLICATIONS

This application is a national stage application (under 35 U.S.C. §371) of PCT/EP2008/051534, filed Feb. 8, 2008, which claims benefit of German Application No. 10 2007 006 378.6, filed Feb. 8, 2007.

The invention relates to photopolymerizable flexographic printing elements which contain ethylenically unsaturated, alicyclic monomers and hard flexographic printing plates, in particular cylindrical continuous seamless flexographic printing plates, which can be produced therefrom.

The hardness and the thickness of flexographic printing plates depend on the print medium on which printing is to be effected. While relatively thick and soft flexographic printing plates are used when printing on soft print media, such as corrugated board or cardboard boxes, relatively thin and hard flexographic printing plates are used for high-quality halftone printing, for example for printing on plastic films or paper. Flexographic printing plates suitable for high-quality halftone printing should have in particular a large tonal value range and a small increase in tonal value.

Flexographic printing plates may be plate-shaped or cylindrical. Cylindrical flexographic printing plates are known in principle. In the case of a cylindrical flexographic printing plate, the printing cylinder of the printing press is provided with a printing layer or a print relief over the entire circumference. Cylindrical printing plates are very important to the printing of continuous patterns and are used, for example, for the printing of wallpapers, decorative papers or gift-wrapping papers. However, they are also used for the printing of non-continuous motifs in order to achieve printing which is as highly cost-efficient as possible by means of the skilful arrangement of a plurality of copies.

In principle, the actual printing cylinder for the printing press can itself be provided with a completely enveloping printing layer. However, this procedure has the disadvantage that in certain circumstances the entire printing cylinder has to be replaced when changing the printing plate. This is extremely complicated and accordingly expensive.

The use of so-called sleeves is therefore usual. A sleeve is a cylindrical hollow body, also referred to as a sleeve, which has been provided with a printing layer or a print relief. The sleeve technique permits very rapid and simple changing of the printing plate. The internal diameter of the sleeves corresponds to the external diameter of the printing cylinder so that the sleeves can be simply pushed over the printing cylinder of the printing press. The pushing on and pushing off of the sleeves functions virtually exclusively according to the air cushion principle: for the sleeve technology, the printing press is equipped with a special printing cylinder, a so-called air cylinder. The air cylinder has a compressed air connection at the end face, by means of which compressed air can be passed into the interior of the cylinder. From there, it can emerge again via holes arranged on the outside of the cylinder. For mounting a sleeve, compressed air is passed into the air cylinder and emerges again at the outlet holes. The sleeve can now be pushed onto the air cylinder because it expands slightly under the influence of the air cushion, and the air cushion substantially reduces the friction. When the compressed air supply is terminated, the expansion is eliminated and the sleeve rests firmly on the surface of the air cylinder. Further details of the sleeve technique are disclosed, for example, in "Technik des Flexodrucks [Flexographic printing technique]", page 73 et seq., Coating Verlag, St. Gallen, 1999.

However, high-quality circular printing plates cannot be produced by simply completely surrounding the printing cylinder or a sleeve with a flexographic printing plate processed ready for printing. In fact, a fine gap remains at the abutting ends of the printing plate and, in the case of true continuous motifs or offset copies, always also intersects printing parts of the plate. This gap leads to a clearly visible line in the printed image. In order to avoid this line, only non-printing wells may be present in this area; thus, it is not possible to print any desired patterns. Moreover there is in this technique the danger that the solvent present in the printing ink can penetrate into the gap and release the ends of the printing plate from the printing cylinder. This leads to even greater defects in the printed image. Clearly visible traces still remain in the printed image even on adhesive bonding of the ends.

For the production of high-quality circular printing plates, it is therefore necessary to provide the printing cylinder or a sleeve with a completely surrounding, relief-forming, photopolymerizable layer by means of suitable techniques. This can be effected, for example, by coating from solution or by annular extrusion. However, both techniques are extremely complicated and therefore correspondingly expensive. In particular, a separate, high-precision tool must be produced and used as a rule for each new external diameter in these techniques. The widespread practice is therefore to wrap the printing cylinder or the sleeve with a prefabricated, thermoplastically processable layer of photopolymerizable material and to seal the abutting edges of the photopolymerizable layer, also referred as seam, as well as possible by means of suitable techniques. Only in a second step is the cylindrical photopolymerizable flexographic printing element processed to give the finished circular printing plate.

In the production of photopolymerizable flexographic printing elements with the use of prefabricated layers, it is particularly important to seal the seam completely and with extreme precision. The importance of this process step has further increased in recent years. Modern photopolymerizable flexographic printing elements, such as, for example, digitally imageable flexographic printing elements, permit the production of flexographic printing plates having substantially higher resolution than was the case earlier. Flexographic printing is therefore also increasingly entering those areas which were previously the preserve of other printing processes. At higher resolution, however, defects in the printing surface of the flexographic printing plate are also more quickly visible. For the same reason, high precision must also be ensured on application of the photopolymerizable, relief-forming layer. Thickness differences in the relief-forming layer have a considerable adverse effect on the concentricity of the printing cylinder and on the print quality. In the case of high-quality flexographic printing plates, the thickness tolerance should usually be not more than ±10 µm. If the thickness tolerance of the photopolymerizable layer of the sleeve is not sufficient, the surface of the sleeve has to be reworked. Such a procedure is of course extremely complicated, tedious and uneconomical.

WO 2004/092841 therefore proposed an improved process for the production of cylindrical, continuous seamless, photopolymerizable flexographic printing elements, which ensures better closure of the seam than in the known technologies and very good concentricity. In this way, cylindrical, continuous seamless photopolymerizable flexographic printing elements can be produced in high quality in a short time. The achievable seam closure is very good, and reworking of the flexographic printing element obtained by complicated grinding and smoothing processes is superfluous. The process comprises the following steps:

a) providing a layer composite at least comprising a layer of a photopolymerizable material and a substrate sheet which can be peeled off from the layer,
b) cutting those edges of the layer composite which are to be joined to size by means of mitre cuts,
c) pushing on and locking the hollow cylinder on a rotatably mounted substrate cylinder,
d) applying an adhesion-promoting layer to the outer surface of the hollow cylinder,
e) applying the layer composite cut to size, with the side facing away from the temporary substrate sheet, to the hollow cylinder provided with the adhesion-promoting layer, the ends provided with the mitre cut substantially lying one on top of the other but not overlapping,
f) peeling the substrate sheet off from the layer of photopolymerizable material,
g) joining the cut edges at a temperature below the melting point of the photopolymerizable layer by bringing the surface of the photopolymerizable layer on the hollow cylinder into contact with a rotating calender roll until the cut edges are joined to one another, and
h) removing the processed hollow cylinder from the substrate cylinder.

To summarize, in the process disclosed, a layer of photopolymerizabie material is applied without a substrate sheet, by means of a suitable adhesion-promoting layer, to the outer surface of a hollow cylinder, the layer ends of which are then joined without a gap by calendaring under the action of heat.

Dispensing with a substrate sheet is indispensible for the process disclosed in WO 2004/092841 but is also associated with certain disadvantages with regard to the achievable hardness of the flexographic printing plate which is produced using said flexographic printing element.

The hardness of the finished printing plate, the so-called plate hardness, is in fact determined both by the hardness of the actual cured, elastomeric printing layer and by the hardness of the substrate sheet. The influence of the substrate sheet here is of course all the greater the thinner the elastomeric layer. Reference may be made here by way of example to Nyloflex® ACE (from Flint Deutschland GmbH), which is recommended in particular for high-quality halftone printing. The hardness of the cured, elastomeric layer itself (i.e. without the substrate), measured according to DIN 53505 on a 6 mm thick elastomeric material, is 62° Shore A. The plate hardness including the substrate film (thickness: 175 µm) is 64° Shore A at a plate thickness of 2.84 mm, 79° Shore A at 1.14 mm and 88° Shore A at 0.76 mm. If the substrate sheet is removed from the 1.14 mm thick plate, the hardness of the remaining elastomeric layer is only 73.6° Shore A. This reduced hardness leads during printing to a smaller tonal value range in comparison with the plate with substrate sheet. Particularly for cylindrical printing plates where the elastomeric layer is applied without additional substrate sheet to the cylindrical substrate, it is therefore extremely desirable to use relatively hard elastomeric layers. In order to be able to compensate said loss of hardness as a result of dispensing with the substrate sheet, it is desirable to have available flexographic printing plates whose hardness, according to DIN 53505 (i.e. the hardness of the elastomeric layer of the finished printing plate without substrate sheet, measured at a layer thickness of 6 mm), is at least 66° Shore A.

However, the increase in the hardness is by no means trivial since it is at the same time necessary to ensure that other important properties of the flexographic printing plate do not deteriorate in the course of measures for increasing the hardness. In addition to a sufficient hardness of the printing plate, further boundary conditions must be fulfilled in order to achieve a very good printed copy.

(1) Isotropic Behaviour of the Finished Printing Plate:

The finished flexographic printing plate should show isotropic behaviour, i.e. the mechanical properties and the printing properties should be independent of the orientation of the flexographic printing element in the printing press. A measure of the degree of anisotropy is the anisotropy factor AF. The realization of harder anisotropy-free plates is therefore not trivial since the tendency of a printing plate towards anisotropic behaviour increases with increasing hardness. For example, use of costly block copolymers of styrene and butadiene or isoprene, the hardness can usually be increased by using binders having a higher styrene content. However, plates having styrene-rich binders have a strong tendency to anisotropy. This may be due to the fact that, in block copolymers having relatively small amounts of styrene, the styrene phases are arranged as a rule as discrete islands in a polyalkadiene phase but as cylindrical or rod-shaped phases in the case of larger amounts. In the course of the production of flexographic printing elements, the cylindrical or rod-shaped styrene phases may become aligned, causing anisotropic behaviour. Furthermore, a reduction of the plasticizer content leads to a hard plate but also rapidly leads to anisotropic behaviour.

(2) Raw Layer Plasticity of the Flexographic Printing Element:

The raw layer plasticity (cold flow) of the still unexposed, photopolymerizable flexographic printing element should be as low as possible since the storage, handling and the processability to the flexographic printing element are significantly complicated by an excessively high raw layer plasticity. In the case of a raw layer plasticity which is too high, slight pressure on the flexographic printing element, for example due to inept handling of the flexographic printing element, may be sufficient to lead to irreversible deformation of the layer so that, as a consequence, a completely unusable flexographic printing plate is obtained. Particularly if the hardness of the printing plate is to be achieved by a higher monomer concentration in the photopolymerizable layer, it is precisely this higher monomer concentration that leads to a significant increase in the raw layer plasticity.

(3) Round Processability of the Photopolymerizable Layer:

The unexposed photopolymerizable flexographic printing element should be capable of round processing by the process described in WO 2004/092841. Good round processability correlates with the melt flow index of the photopolymerizable flexographic printing element at the processing temperature. The higher this is, the better is the round processability of the plate. The melt flow index of the photopolymerizable layer at a temperature of 100° C. and an applied weight of 5 kg was used as a measure of the round processability.

It was an object of the invention to provide improved photopolymerizable flexographic printing elements which can be processed to flexographic printing plates having greater hardness, in particular to flexographic printing plates in which the Shore A hardness of the elastomeric layer is at least 66° Shore A, measured according to DIN 53505 on a 6 mm thick layer without substrate sheet, without anisotropic flexographic printing elements being obtained thereby.

It was an object of the invention in particular to provide a photopolymerizable, cylindrical continuous seamless flexographic printing element which can be produced by the process described in WO 2004/092841 and with which a very good printed copy is achieved. In particular, the flexographic printing plate produced should give a small increase in tonal value and a large tonal value range during printing and should have no anisotropy. The photopolymerizable relief-forming layer should have good round processability and an acceptable raw layer plasticity.

Surprisingly, it has been found that harder but nevertheless substantially anisotropy-free flexographic printing elements having acceptable raw layer plasticity and nevertheless good round processability of the photopolymerizable layer are provided by the use of special monomers in the photopolymerizable, relief-forming layer.

Accordingly, the invention relates to a photopolymerizable flexographic printing element for the production of hard flexographic printing plates, at least comprising
a dimensionally stable substrate,
a photopolymerizable, relief-forming layer containing, based in each case on the total amount of all components of the relief-forming layer,
40 to 90% by weight of a binder containing at least one thermoplastic elastomeric block copolymer comprising at least one block formed from an alkenyl aromatic and at least one block formed from a 1,3-diene,
0.1 to 20% by weight of ethylenically unsaturated monomers M,
0.1 to 5% by weight of photoinitiator and
1 to 40% by weight of plasticizer,
characterized in that the photopolymerizable, relief-forming layer contains at least one ethylenically unsaturated monomer M1 of the general formula $E_n$-R″ as monomers M, E representing an ethylenically unsaturated group and n representing a natural number from 1 to 3, and R″ representing an alicyclic, saturated or unsaturated hydrocarbon radical which has at least 6 carbon atoms and can optionally also be substituted by further aliphatic linear or branched hydrocarbon groups, and in addition may optionally contain one or more further monomers M2.

The photopolymerizable flexographic printing elements according to the invention may be both plate-like flexographic printing elements and cylindrical, preferably continuous seamless flexographic printing elements. In a preferred embodiment of the invention, the flexographic printing elements are cylindrical flexographic printing elements.

The present invention furthermore relates to a layer composite comprising a peelable, temporary substrate sheet, optionally an elastomeric substrate layer, the photopolymerizable, relief-forming layer and a peelable temporary cover sheet, for the production of a cylindrical flexographic printing element.

Suitable dimensionally stable substrates are the substrates known from flexographic printed plate technology, for example plates, sheets or cylindrical tubes. The materials of the substrates may be, for example, metals, such as, for example, steel or aluminium, or plastics, such as, for example, polyethylene terephthalate, polybutylene terephthalate, polyethylene naphthalate or polycarbonate. The substrates may optionally have been treated with customary adhesion-promoting layers.

The photopolymerizable material present in the photopolymerizable, relief-forming layer comprises at least one thermoplastic elastomeric block copolymer, at least one ethylenically unsaturated monomer, at least one photoinitiator and at least one plasticizer and optionally further components.

The thermoplastic elastomeric block copolymers comprise at least one block which is formed from alkenylaromarics and one block which is formed from 1,3-alkadienes. The alkenylaromastics may be, for example, styrene, α-methylstyrene or vinyltoluene. Styrene is preferred. It is possible to use block copolymers of the styrene-butadiene type (middle block: butadiene phase), of the styrene-isoprene type (middle block: isoprene phase) or of the styrene-butadiene-isoprene type (middle block: butadiene-isoprene phase). The block copolymers may be linear, branched or radial block copolymers. In general, they are three-block copolymers of the A-B-A type, but may also be two-block copolymers of the A-B type or those having a plurality of alternating elastomeric and thermoplastic blocks, e.g. A-B-A-B-A. It is also possible to use mixtures of two or more different block copolymers. Commercially available three-block copolymers frequently contain certain proportions of two-block copolymers. The diene units may be 1,2- or 1,4-linked. Thermoplastic elastomeric block copolymers having terminal blocks of styrene and a random styrene-butadiene middle block, which are available under the name Styroflex®, may furthermore be used. Of course, it is also possible to use mixtures of a plurality of thermoplastic elastomeric binders, provided that the properties of the relief-forming layer are not adversely influenced thereby.

In a preferred embodiment, a binder of the styrene-butadiene type is used. Particularly preferred binders are linear, radial or branched block copolymers of the styrene-butadiene type. These block copolymers have an average molecular weight $M_w$ (weight average) of 80 000 to 250 000 g/mol, preferably 80 000 to 150 000 g/mol and particularly preferably 90 000 to 130 000 g/mol and have a styrene content of 20 to 40% by weight, preferably 20 to 35% by weight and particularly preferably 20 to 30% by weight.

In a further preferred embodiment of the invention, the binder is of the styrene-isoprene type. Preferred binders of the styrene-isoprene type contain as a rule 13 to 40% by weight, preferably 13 to 35% by weight and particularly preferably 14 to 30% by weight of styrene.

In addition to said block copolymers, the photopolymerizable layer may also comprise further elastomeric binders differing from the block copolymers. With such additional binders, also referred to as secondary binders, the properties of the photopolymerizable layer can be modified. As a rule, the amount of said secondary binders should not exceed 25% by weight, based on the total amount of all binders used. Preferably, the amount does not exceed 15% by weight, particularly preferably does not exceed 10% by weight, and very particularly preferably exclusively said block copolymers of alkenyl aromatics and 1,3-dienes are present.

The total amount of binders is in this case 40 to 90% by weight, based on the sum of all constituents of the relief-forming layer, preferably 45 to 75% by weight and particularly preferably 50 to 70% by weight.

The photopolymerizable relief-forming layer furthermore comprises at least one ethylenically unsaturated monomer M. The monomers M used are compatible with the binders and have at least one polymerizable, ethylenically unsaturated group. In addition to the ethylenically unsaturated monomer or monomers M1, further ethylenically unsaturated monomers M2 may be in the present.

The monomers M1 are compatible with the polyalkadiene blocks of the binders, i.e. with the middle block in the case of three-block copolymers. Suitable monomers M1 have the general formula $E_n$-R″, R″ representing an n-valent hydrocarbon radical, E representing an ethylenically unsaturated group and n representing a natural number from 1 to 3, preferably 1 or 2. The ethylenically unsaturated groups are preferably acrylate or methacrylate groups. At least one monomer M1 which comprises two ethylenically unsaturated groups E, in particular two (meth)acrylate groups, is preferably used.

According to the invention, the hydrocarbon radical R″ is an alicyclic, saturated or unsaturated hydrocarbon radical which has at least 6 carbon atoms and may optionally also be substituted by further aliphatic linear or branched hydrocarbon groups. In the context of this invention, the term alicyclic is used in the usual sense, namely for saturated or unsaturated aliphatic hydrocarbon radicals which have cyclic structural elements. These are therefore not aromatic hydrocarbon radicals. The alicyclic radical may be a monocyclic radical or a polycyclic radical, in particular bi- or tricyclic radical. Saturated alicyclic radicals are preferred. Preferred radicals comprise at least one five-membered ring and/or one six-membered ring as a structural element.

Preferred monomers M1 are selected from the group consisting of monomers

M1a: mono(meth)acrylates of the general formula $H_2=CR—C(O)O—R^1$, R representing H or a methyl group, and $R^1$ being a monovalent, alicyclic hydrocarbon radical having 6 to 20, preferably 6 to 16, carbon atoms, and M1b: di(meth)acrylates of the general formula $H_2=CR—C(O)O—R^2—O(O)C=CH_2$, R representing H or a methyl group, and $R^2$ being a divalent alicyclic hydrocarbon radical having 10 to 20, preferably 12 to 20, carbon atoms.

Examples of suitable monomers M1a are cyclohexyl (meth)acrylate, substituted cyclohexyl(meth)acrylates, such as 4-tert-butylcyclohexyl(meth)acrylate, isobornyl (meth) acrylate and dicyclopentadienyl(meth)acrylate.

Examples of suitable monomers M1b are tricyclodecanedimethanol diacrylate and tricyclodecanedimethanol dimethacrylate.

The monomer M1 is particularly preferably tricyclodecanedimethanol diacrylate.

Owing to their compatibility with the polyalkadiene phases, the monomers M1 used according to the invention appear to accumulate preferentially in the polyalkadiene phases and accordingly to increase the volume of the polyalkadiene phases. This appears effectively to increase the values of the flexographic printing plates and at the same time to suppress the orientation of the styrene phases to give cylindrical or rod-like phases.

Of course, mixtures of different monomers M1 can also be used. In general, the amount of monomers M1 is 0.1 to 20% by weight, preferably 0.5 to 18% by weight, particularly preferably 2 to 15% by weight, very particularly preferably 4 to 13% by weight and, for example, 6 to 13% by weight, based on the sum of all constituents of the relief-forming layer.

In addition to the monomers M1 used according to the invention, further comonomers M2 differing from the monomers M1 can also be used. Comonomers M2 which may be used are in particular esters or amides of acrylic acid or methacrylic acid with mono- or polyfunctional alcohols, amines, amino alcohols or hydroxy ethers and hydroxy esters, esters of fumaric or maleic acid and allyl compounds, esters or amides of acrylic acid or methacrylic acid being preferred. 1,4-Butanediol diacrylate, 1,6-hexanediol diacrylate, 1,6-hexanediol dimethacrylate, 1,9-nonanediol diacrylate, trimethylolpropane tri(meth)acrylate, dioctyl fumarate and N-dodecylmaleimide are preferred and 1,6-hexanediol diacrylate is particularly preferred. In general, the amount of the comonomers M2 is 0 to 10% by weight, preferably 0 to 8% by weight and particularly preferably 0 to 6% by weight, based on the sum of all constituents of the relief-forming layer.

If further monomers M2 are present in the photopolymerizable relief-forming layer, the weight ratio of the monomers M1:M2 should be at least 1:1, preferably at least 1.5:1, particularly preferably at least 2:1 and very particularly preferably at least 3:1. It is preferably not more than 10:1. The total amount of all monomers M1 and M2 in the layer is 0.1 to 20% by weight, preferably 0.5 to 18% by weight, particularly preferably 2 to 15% by weight, very particularly preferably 4 to 18% by weight and, for example, 8 to 15% by weight, based on the sum of all constituents of the relief-forming layer.

In a preferred embodiment of the invention, the photopolymerizable, relief-forming layer comprises, as monomer M, at least one monomer M1b and at lest one monomer M2, the ratio M1:M2 being at least 3:1 and preferably not more than 10:1. M2 is preferably a monomer having two (meth)acrylate groups.

In a particularly preferred embodiment of the invention, the photopolymerizable, relief-forming layer comprises, as monomers M1, at least tricyclodecanedimethanol diacrylate and a further monomer M2 in the ratio of at least 3; 1 and preferably of 10:1, the total amount of tricyclodecanedimethanol diacrylate and the further monomer M2 preferably being 10 to 15% by weight. In this embodiment, M2 is preferably 1,6-hexanediol diacrylate.

The photopolymerizable, relief-forming layer furthermore comprises at least one photoinitiator or a photoinitiator system. Examples of suitable initiators are benzoin or benzoin derivatives, such as methylbenzoin or benzoin ether, benzil derivatives, such as benzil ketals, acylarylphosphine oxides, acylarylphosphinic acid esters, polynuclear quinones or benzophenones. The amount of photoinitiator in the relief-forming layer is as a rule 0.1 to 5% by weight, preferably 0.5 to 4% by weight and particularly preferably 1 to 3% by weight, based on the amount of all constituents of the relief-forming layer.

According to the invention, the relief-forming layer furthermore comprises a plasticizer. It is also possible to use mixtures of different plasticizers. Examples of suitable plasticizers comprise modified and unmodified natural oils and natural resins, such as high-boiling paraffinic, naphthenic or aromatic mineral oils, synthetic oligomers or resins, such as oligostyrene, high-boiling esters, oligomeric styrene-butadiene copolymers, oligomeric α-methylstyrene/p-methylstyrene copolymers, liquid oligobutadienes, in particular those having a molecular weight between 500 and 5000 g/mol, or liquid oligomeric acrylonitrile-butadiene copolymers or olgiomeric ethylene-propylene-diene copolymers. Polybutadiene oils, high-boiling aliphatic esters and mineral oils or liquid isoprene rubber, preferably having a molecular weight of 500 to 5000 g/mol and a viscosity of 500 to 200 000 mPa·s at 25° C. Particularly preferred plasticizers are polybutadiene oils having a high proportion of 1,2-vinyl groups, since these lead to a higher crosslinking density and hence to harder plates in comparison with polybutadiene oils having a low 1,2-vinyl group content. In general, the proportion of 1,2-vinyl groups, based on the total content of vinyl groups, is >10%, preferably >25%, particularly preferably >40%. In general, the plasticizer content is 0 to 40% by weight, preferably 10 to 35% by weight, particularly preferably 15 to 30% by weight.

The photopolymerizable relief-forming layer may furthermore contain typical additives. Examples of such additives are dyes, thermal polymerization inhibitors, fillers and antioxidants. However, the amount of such additives should as a rule not exceed 10% by weight, based on the amount of all components of the relief-forming layer, preferably 5% by weight.

The raw layer plasticity of the photopolymerizable relief-forming layer (before the photopolymerization/development) is generally 5 to 16, preferably 8 to 15. The raw layer plasticity is the difference between the initial layer thickness of the photopolymerizable relief-forming layer and the layer thickness after loading with a 50 g weight for one minute, the difference being stated in % of the initial value.

The melt flow index (MVR) for the photopolymerizable, relief-forming layer (before the photopolymerization/development) is generally 5 to 50 cm³/10 min, preferably 8 to 50 cm³/10 min. The melt flow index (MVR) is determined at a temperature of 100° C. and with applied weight of 5 kg as described in DIN. ISO 1133.

Owing to the use of the special monomers, the hardness of the relief layer of the flexographic printing plates, i.e. of the photopolymerized relief layers obtained from the photopolymerizable layers by polymerization, is, according to the invention, at least 66° Shore A according to DIN 53505. The method of measurement is described in detail in the experimental section. In general, the Shore A hardness of the photopolymerized layer is 66 to 90° Shore A, preferably 66 to 85° Shore A and particularly preferably 68 to 85° Shore A.

In general, the anisotropy factor of the relief layer of the flexographic printing plates is less than 1.2, preferably less than 1.1. The anisotropy factor AF is defined as follows:

$$AF = \sigma_{MD}(125\%)/\sigma_{TD}(125\%) \text{ if } \sigma_{MD}(125\%) > \sigma_{TD}(125\%)$$

$$AF = \sigma_{TD}(125\%)/\sigma_{MD}(125\%) \text{ if } \sigma_{TD}(125\%) > \sigma_{MD}(125\%)$$

where $\sigma_{MD}(125\%)$ is the tensile stress in the extrusion direction at 125% elongation and $\sigma_{TD}(125\%)$ is the tensile stress transverse to the extrusion direction at 125% elongation.

An elastomeric substrate layer may optionally be present on the substrate sheet optionally coated with the nontacky release layer. Under processing conditions, the elastomeric substrate layer has fusibility and flowability and has a sufficiently high adhesion to the adhesion-promoting layer applied to the hollow cylinder or to the adhesive tape, even after exposure or pre-exposure from the back. The substrate layer can optionally be photochemically crosslinkable.

The elastomeric substrate layer may replace the lacking substrate sheet with regard to the mechanical properties thereof. Thus, in spite of the lacking rigid substrate sheet, there is no formation of start-up edges in the print. In contrast to a substrate sheet, however, it is fusible and flowable under the processing conditions. Furthermore, the substrate layer may have a higher adhesion to the adhesion-promoting layer applied to the hollow cylinder than the photopolymerizable relief-forming layer. The tape gap is bridged owing to the hardness and rigidity of the substrate layer. The photopolymerizable relief-forming layer is present on the elastomeric substrate layer.

Like the photopolymerizable relief-forming layer, the elastomeric substrate layer, too, contains at least one elastomeric binder.

Elastomeric binders very particularly preferably present in the elastomeric substrate layer are three-block copolymers of the type A-B-A, radial block copolymers of the type $(AB)_n$, in which A is styrene and B is a diene, and statistical copolymers and random copolymers of styrene and a diene. In the case of the elastomeric substrate layer, the total amount of elastomeric binders may be up to 100% by weight. Usually, it is 75 to 100% by weight, preferably 85 to 100% by weight and particularly preferably 90 to 100% by weight.

The photopolymerizable flexographic printing elements according to the invention can be produced by methods known in principle to the person skilled in the art, for example by melt extrusion, casting or lamination in a one-stage or multistage production process. The production by means of melt extrusion, in which first the constituents of the relief-forming layer are mixed with one another in an extruder with heating, is preferred. For the production of sheet-like flexographic printing elements, the photopolymerizable material from the extruder can be applied through a slot die between two sheets and the layer composite can be calendered, the type of sheets depending on the desired use. Here, they may be sheets which have good adhesion to the photopolymerizable layer or readily peelable (temporary) sheets. For the production of sheet-like flexographic printing elements, a strongly adhering substrate sheet and a peelable cover sheet are usually used. If it is intended to subject the layer to further processing by the process described below to give cylindrical flexographic printing elements, two peelable sheets are used. For the production of photopolymerizable, cylindrical flexographic printing elements, a seamless layer can also be applied directly to a cylindrical substrate by means of annular extrusion. The thickness of the photopolymerizable layer is in general 0.4 to 7 mm, preferably 0.5 to 4 mm and particularly preferably 0.7 to 2.5 mm.

The production of cylindrical continuous seamless flexographic printing elements and the further processing thereof to give continuous seamless printing plates can be effected on the basis of the process described in WO 2004/092841.

Accordingly a cylindrical, continuous seamless photopolymerizable flexographic printing element is produced by a) providing a layer composite comprising a peelable temporary substrate sheet, optionally an elastomeric substrate layer, a photopolymerizable, relief-forming layer as defined in any of Claims 1 to 11 and a peelable temporary cover sheet, b) cutting to size the edges of the layer composite which are to be joined, c) pushing on and locking a hollow cylinder on a rotatably mounted support cylinder, d) applying an adhesion-promoting layer to the outer surface of the hollow cylinder, e) applying the layer composite cut to size and comprising the photopolymerizable relief-forming layer, optionally the elastomeric substrate layer and the peelable cover sheet to the hollow cylinder provided with the adhesion-promoting layer, after peeling off the temporary substrate sheet with the photopolymerizable relief-forming layer or the elastomeric substrate sheet, f) peeling off the cover sheet from the layer of photopolymerizable material, g) joining the cut edges at a temperature below the melting point of the photopolymerizable layer by bringing the surface of the photopolymerizable layer on the hollow cylinder into contact with a rotating calender roll until the cut edges are joined to one another, h) removing the processed hollow cylinder from the support cylinder.

Cylindrical flexographic printing elements can, however, also be produced by other techniques.

A prefabricated layer of photopolymerizable material is produced as the starting material for the process according to WO 2004/092841. The photopolymerizable layer can optionally be pre-exposed to actinic light from the back prior to application to the hollow cylinder. The pre-exposure should as a rule be effected before the layer composite has been cut to size in step (b), in order to ensure homogeneous, uniform pre-exposure even in the edge regions. If a UV-transparent sleeve was used, the pre-exposure can also be effected from the inside of the sleeve after application of the layer to the sleeve. Those edges of the layer composite provided which are to be joined are then cut to size.

The cutting to size of the edges to be joined is preferably effected by means of mitre cuts.

The hollow cylinders used as substrates are customary hollow cylinders which are suitable for mounting on air cylinders, i.e. may expand slightly under the influence of compressed air. Such hollow cylinders are also referred as sleeves, basic sleeves, or the like.

The hollow cylinders used are then pushed onto a rotatably mounted support cylinder and locked, such that the hollow cylinder is firmly connected to the support cylinder. The support cylinder firmly retains the hollow cylinder for the subsequent calendering process.

Thereafter, the adhesion-promoting layer is applied to the outer surface of the hollow cylinder. The adhesion-promoting layer should impart good adhesion even at elevated temperatures as prevail during the calendering process. It should in particular impart very good shear strength so that the photopolymerizable layer does not slip on the surface of the hollow cylinder during the calendering process. The adhesion-promoting layer may be a suitable adhesion-promoting coating which is applied to the surface of the hollow cylinder. However, the adhesion-promoting layer is preferably a double-sided adhesive sheet. In particular, the adhesive sheets may be foam adhesive sheets which additionally have a damping foam layer.

The photopolymerizable layer is then applied to the hollow cylinder provided with the adhesion-promoting layer. If those edges of the layer composite which are to be joined have been cut to size by means of mitre cuts, the ends provided with the mitre cut lie substantially one on top of the other without overlapping. After the application of the layer, the temporary cover sheet, including any nontacky release layer present, is peeled off from the layer of photopolymeric material.

The cut edges are then joined. For joining the cut edges, the surface of the photopolymerizable layer on the hollow cylinder is brought into contact with a rotating calender roll until the cut edges are joined to one another. The support cylinder and the calender roll rotate in opposite directions. The necessary calender pressure is determined by the person skilled in the art according to the type of photopolymerizable layer by adjusting the distance between the support cylinder and the calender roll. The calendering temperature depends on the type of photopolymerizable layer and the desired properties. According to the invention, the temperature of the calendering roll is, however, adjusted so that the temperature of the photopolymerizable layer is in any case below the melting point thereof. Expediently, heat is supplied by using a calender roll heated from the inside, an IR radiator or warm gas streams. Of course, heat sources may also be combined. As a rule, the temperature during calendering is 80 to 140° C., preferably 90 to 130° C., measured in each case at the surface of the photopolymerizable layer. As a rule, about 15 min are required for complete gap closure, this time also depending of course on the chosen temperature and the pressure.

After the sealing of the seam and optionally cooling, the processed hollow cylinder/finished sleeve is removed again from the support cylinder.

The further processing of the photopolymerizable flexographic printing elements to give finished flexographic printing plates can be effected by various techniques. The flexographic printing elements can, for example, be exposed imagewise in a manner known in principle, and the unexposed parts of the relief-forming layer can then be removed by means of a suitable development process. The imagewise exposure can in principle be effected by covering the photopolymerizable flexographic printing elements with a photographic mask and exposing through the mask.

Preferably, however, the imaging is not carried out by means of digital masks. Such masks are also known as in situ masks. For this purpose, a digitally imagable layer is first applied to the photopolymerizable, relief-forming layer. The digitally imagable layer is preferably an IR-ablative layer, inkjet layer or thermographically inscribable layer.

IR-ablative layers or masks are opaque to the wavelengths of actinic light and usually comprise a binder and at least one IR absorber, such as, for example, carbon black. Carbon black also ensures that the layer is opaque. A mask can be written into the IR-ablative layer by means of an IR laser, i.e. the layer is decomposed and removed at the points where they are impinged with the laser beams. Examples of the imaging of flexographic printing elements using IR-ablative masks are disclosed, for example, in EP-A 654 150 or EP-A 1 069 475.

In the case of inkjet layers, a layer which is inscribable with inkjet inks and is transparent to actinic light, for example a gelatin layer, is applied. A mask is applied thereon by means of inkjet printers using opaque ink. Examples are disclosed in EP-A 1 072 953.

Thermographic layers are layers which contain substances which become black under the influence of heat. Such layers comprise, for example, a binder and an organic silver salt and can be imaged by means of a printer having a thermal printing head. Examples are disclosed in EP-A 1 070 989.

The digitally imageable layers can be produced by dissolving or dispersing all constituents of the respective layer in a suitable solvent and applying the solution to the photopolymerizable layer of the cylindrical flexographic printing element, followed by evaporation of the solvent. The application of the digitally imagable layer can be effected, for example, by spraying on or by means of the technique described by EP-A 1 158 365.

After the application of the digitally imagable layer, the latter is imaged by means of the respective suitable technique, and the photopolymerizable layer is then exposed to actinic light through the resulting mask in a manner known in principle. Suitable actinic, i.e. chemically "active", light is in particular UVA or UV/VIS radiation. Exposure units for plate-shaped flexographic printing elements and rotary cylindrical exposure units for uniform exposure of cylindrical flexographic printing elements are commercially available.

The development of the imagewise exposed layer can be effected in a conventional manner by means of a solvent or a solvent mixture. The unexposed parts of the relief layer, i.e. those parts covered by the mask, are removed by dissolution in the developer, while the exposed, i.e. crosslinked, parts are retained. The mask or remainder of the mask is likewise removed from the developer if the components are soluble therein. If the mask is not soluble in the developer, it is removed with the aid of a second solvent, optionally prior to development.

The development can also be effected thermally. In the thermal development, no solvent is used. Instead, after the imagewise exposure, the relief-forming layer is brought into contact with an absorbing material and heated. The absorbing material is, for example, a porous nonwoven, for example comprising nylon, polyester, cellulose or inorganic materials. It is heated to a temperature such that the unpolymerized parts of the relief-forming layer become liquid and are absorbed by the nonwoven. The saturated nonwoven is then removed. Details of the thermal development are disclosed, for example, by U.S. Pat. No. 3,264,103, U.S. Pat. No. 5,175,072, WO 96/14603 or WO 01/88615. The mask can optionally be removed beforehand by means of a suitable solvent or also thermally.

The relief layer of the flexographic printing plates ready for printing, i.e. of the photopolymerized layer, has, according to the invention, a hardness of at least 66°Shore A according to DIN 53505. In general, the Shore A hardness of the photopolymerized layer is 66 to 90° Shore A, preferably 66 to 85 Shore A and very particularly preferably 68 to 85° Shore A.

The production of flexographic printing plates from the photopolymerizable flexographic printing elements can also be carried out by means of direct laser engraving. In this process, the photopolymerizable layer is first crosslinked completely in the entire volume with actinic light, electron beams or γ rays, without application of a mask. Thereafter, a print relief is engraved into the crosslinked layer by means of one or more lasers.

The uniform crosslinking can be effected using customary exposure units for flexographic printing plates, as described above. Particularly advantageously, however, it can also be effected similarly to the process described in WO 01/39897—particularly in the case of cylindrical, continuous seamless flexographic printing plates. Here, exposure is effected in the presence of an inert gas which is heavier than air, for example $CO_2$ or Ar. For this purpose, the photopolymerizable, cylindrical flexographic printing element is lowered into an emersion tank which is filled with inert gas and the walls of which are preferably lined with a reflective material, for example aluminium foil. Exposure to actinic light is then effected. For this purpose, it is possible in principle to use the customary UV or UV/VIS sources of actinic light. It is preferable to use radiation sources which emit substantially visible light and no UV light or only small proportions of UV light. Light sources which emit light having a wavelength of more than 300 nm are preferred. For example, customary halogen lamps or UVA tubes can be used.

In the direct laser engraving, the relief layer absorbs laser radiation to such an extent that it is removed or at least detached in the areas in which it is exposed to a laser beam of sufficient intensity. The layer is preferably evaporated off or thermally or oxidatively decomposed without melting beforehand, so that its decomposition products are removed in the form of hot gasses, vapours, fumes or small particles from the layer.

In particular, lasers which have a wavelength of 9000 nm to 12 000 nm are suitable for engraving the relief-forming layers used according to the invention. $CO_2$ lasers may be mentioned in particular here. The binders used in the relief-forming layer absorb the radiation of such lasers to sufficient extent to permit engraving.

Advantageously, the flexographic printing plate obtained can subsequently be cleaned in a further process step after the laser engraving. In some cases, this can be effected by simply blowing off with compressed air or brushing off. However, it is preferable to use a liquid cleaning agent for the subsequent cleaning, in order also to be able to remove polymer fragments completely. For example, aqueous cleaning agents which substantially comprise water and optionally small amounts of alcohols and which may contain auxiliaries, such as, for example, surfactants, emulsifiers, dispersants or bases, for supporting the cleaning process are suitable. Water-in-oil emulsions, as disclosed by EP-A 463 016, are also suitable. Preferably used cleaning agents are those which have at least one organic component, which is capable of removing the decomposition products which have accumulated on the relief of the flexographic printing element in the course of the laser engraving, without the relief layer swelling substantially during the cleaning process. Such cleaning agents are disclosed, for example, in WO2005/113240.

The use, according to the invention, of the monomers M1 makes it possible to obtain harder but nevertheless anisotropy-free flexographic printing plates. Further details concerning the properties are described in the examples below.

Surprisingly, the swelling resistance of the flexographic printing plates also increases. Good swelling resistance is important for high-quality printing so that the flexographic printing plate is not swollen excessively by the solvents present in the printing inks in the course of the printing process. The swelling of the printing plate leads to decreasing hardness of the printing plate and to an undesired change of the printed image with increasing print run: the individual image elements or printing plates, in particular individual dots, become broader and hence the tonal value range increases. The flexographic printing elements according to the invention lead to flexographic printing plates having reduced swellability, i.e. higher swelling resistance.

The invention is explained in more detail by the following examples.

EXAMPLES

In the examples and comparative examples, different cylindrical continuous seamless flexographic printing elements are produced, the photopolymerizable layer of which in each case has a different composition. The flexographic printing elements are then processed to give cylindrical continuous seamless printing plates and are investigated.

1) General Method for the Production of the Photopolymerizable Relief-Forming Layer Used:

In the following examples, the photopolymerizable material is in each case extruded, discharged through a slot die and calendered between (1) a substrate element consisting of a peelable PET substrate sheet coated with a 5 μm thick layer of an elastomeric polyamide (Makromelt® 6900) as a nontacky release layer and an additional, 125 μm thick substrate layer comprising 94% by weight of styrene, 5% by weight of hexanediol dimethacrylate and 1% of benzil dimethyl ketal on the one hand and (2) a PET sheet coated with a nontacky release layer of Makromelt® 6900, as a peelable cover sheet, on the other hand.

The composite of substrate layer and photopolymeric layer had a total thickness of 1.14 mm, excluding the PET sheets.

2) General Method for the Production of the Seamless Continuous Photopolymerizable Flexographic Printing Elements:

For the production of a seamless/continuous printing plate, the sleeve to be covered is first pushed onto the air cylinder of the mounting device. Thereafter, an adhesive sheet is cut to size on the mounting table, the air cylinder is caused to rotate and the sheet is slowly inserted into the gap between auxiliary roll and the air cylinder provided with the sleeve. The adhesive sheet is carried along by the rotation, whereby the auxiliary roll presses the sheet uniformly onto the sleeve so that the adhesive sheet adheres firmly and without bubbles to the sleeve. Thereafter, the protective sheet is peeled off from the adhesive sheet. The sleeve is now provided with an adhesion-promoting layer. In the next step, after removal of the substrate sheet, the photopolymerizable material cut to size is inserted into the gap, carried along, and pressed firmly via the auxiliary roll. Any substrate layer present on the photopolymerizable material remains on the photopolymerizable material and is directed towards the sleeve. After the mounting of the photopolymeric material, the covered sleeve is pushed onto the air cylinder of the calendering unit. After the cover sheet has been peeled off, the calender roll and the air cylinder provided with sleeve, adhesion-promoting layer and photopolymerizable layer are then brought into contact with one another and caused to rotate, and the gap is closed by calendering under the action of pressure and heat.

3) General Method for the Further Processing of the Seamless Continuous Photopolymerizable Flexographic Printing Elements to Give the Finished Seamless/Continuous Printing Plates:

The seamless/continuous printing plates produced in the previous step are coated with the use of a ring coater with a digitally imagable layer (DSL. II 80 solution, Flint Group Printing Plates) and imaged by means of a laser (ESKO. CDI. COMPAKT). The imaged printing plate is then exposed in a rotary cylindrical exposure unit (Flint Group Printing Plates), washed out in a rotary washer (Flint Group Printing Plates) by means of a washout agent (Nylosolv® A, Flint Group Printing Plates), dried in a drier (Flint Group Printing Plates) at 45° C. for one hour and then postexposed in a rotary cylindrical exposure unit.

4) Starting Materials Used:

Kraton® D-1102: SBS block copolymer (Kraton Polymers) having a styrene content of 29.5% by weight and a hardness of 70° Shore A (two block proportion 17%);

Kraton® D-1192: SBS block copolymer (Kraton Polymers) having a styrene content of 30% by weight and hardness of 70° Shore A (two-block proportion <1%);

Kraton® D-1101: SBS block copolymer (Kraton Polymers) having a styrene content of 31% by weight and a hardness of 72° Shore A (two-block proportion 16%);

Polyöl® 130: Polybutadiene oil (Degussa) having a molecular weight of about 3000 g/mol, a viscosity of 2700-3300 mPa·s at 20° C. and a proportion of about 1% of 1,2-vinyl groups;

Nisso® PB. B-1000 Polybutadiene oil (Nippon Soda) having a molecular weight of about 900-1300 g/mol, a proportion of >85% of 1,2-vinyl groups and a viscosity of 5-15 poise at 45° C.;

Laromer® HDDA: 1,6-Hexanediol diacrylate (BASF);

Sartomer® 833S: Tricyclodecanedimethanol diacrylate (Sartomer).

5) Determination of the Measured Values 5.1) Determination of the Melt Flow Index:

The melt flow index (MVR) of the unexposed photopolymerizable layer was determined at a temperature of 100° C. and an applied weight of 5 kg as described in DIN. ISO 1133.

5.2 Determination of the Shore Hardness:

The measurement of the Shore hardness was effected according to DIN 53 505. For this purpose, layers corresponding to the examples were produced with a thickness of 1 mm and crosslinked by uniform exposure to UVA light for 15 minutes (exposure unit F. III, Flint Group Germany GmbH). In each case 6 pieces of 1 mm thick layers of each layer type were stacked one on top of the other in order to achieve a total layer thickness of 6 mm. The hardness of the 6 mm thick layer stack was determined using a hardness-measuring apparatus (Type U72/80E, Heinrich Bareiss Prüfgerätebau GmbH) according to DIN 53 505.

5.3) Determination of the Raw Layer Plasticity:

For the determination of the raw layer plasticity, a piece of unexposed plate was loaded with a 50 g weight (diameter 4 mm) for 1 minute. The raw layer plasticity is the difference between the initial layer thickness and the layer thickness after loading with a 50 g weight for one minute, the difference being stated in % of the initial weight.

5.4) Determination of the Anisotropy Factor:

The tensile stresses required for calculating the anisotropy factor AF according to $AF=\sigma_{MD}(125\%)/\sigma_{TD}(125\%)$ if $\sigma_{MD}(125\%)>\sigma_{TD}(125\%)$ and $AF=\sigma_{TD}(125\%)/\sigma_{MD}(125\%)$ if $\sigma_{TD}(125\%)>\sigma_{MD}(125\%)$, where $\sigma_{MD}(125\%)$=in extrusion direction at 125% elongation and $\sigma_{TD}(125\%)$=transverse to the extrusion direction at 125% elongation, were determined using a tensile strength tester of the type Zwick Z2.5/TN1S (Zwick GmbH & Co. KG).

The flexographic printing element is considered to be substantially isotropic in practice if the anisotropy factor fulfils the condition $AF \leq 1.2$.

According to the general method, the photopolymerizable flexographic printing elements described below were produced and in each case further processed to give flexographic printing plates. The composition of the layer and the measured values obtained are listed in Tables 1 and 2.

Comparative Example C1

Production of a typical hard flexographic printing plate for high-quality halftone printing:

The flexographic printing element was produced in a thickness of 1.14 mm, excluding PET sheets, as described in the general method. The hardness of the plate produced was 62° Shore A according to DIN. The anisotropy factor was 1 and the raw layer plasticity 10.7%.

Comparative Examples C2 and C3

In Comparative Examples C2 and C3, an attempt was made, starting from Comparative Example C1, to achieve the hardness of the flexographic printing element by varying the binder. With Kraton D-1192 (styrene content: 30%) and Kraton D-1101 (styrene content: 31%), two rubbers were used which have a higher styrene content compared with Kraton D-1102 (styrene content: 29.5%).

Comparative Examples C4 to C6

In Comparative Examples C4 to C6, an attempt was made to achieve the hardness of the relief-forming layer by varying the monomer content. Starting from Comparative Example C1, the monomer content was increased stepwise from 8% to 15%.

Comparative Examples C7 to C10

In Comparative Examples C7 to C10, an attempt was made, starting from Comparative Example C4, to increase the hardness of the flexographic printing element by reducing the plasticizer content (Comparative Examples C7 and C8) or by the use of a plasticizer having a high content of vinyl groups.

Examples 1 to 4

In Examples 1 to 4, in addition to HDDA as a monomer (2% by weight in all cases), a second monomer, Sartomer 833 S (tricyclodecanedimethanol diacrylate), was used in an amount of 8% by weight or 13% by weight.

TABLE 1

Formulation of the photopolymerizable layer of comparative examples C1 to C10 (data in % by weight) and measured values obtained: melt flow index and raw layer plasticity of the photopolymerizable flexographic printing element; hardness and anisotropy factor of the finished flexographic printing plate

| | Component | C1 | C2 | C3 | C4 | C5 | C6 | C7 | C8 | C9 | C10 |
|---|---|---|---|---|---|---|---|---|---|---|---|
| Binder | Kraton D-1102 | 59% | | | 57% | 54.5% | 52% | 62% | 67% | 57% | 62% |
| | Kraton D-1192 | | 59% | | | | | | | | |
| | Kraton D-1101 | | | 59% | | | | | | | |
| Monomer | Hexanediol diacrylate | 8% | 8% | 8% | 10% | 12.5% | 15% | 10% | 10% | 10% | 10% |
| Initiator | Benzyl dimethyl ketal | 2% | 2% | 2% | 2% | 2% | 2% | 2% | 2% | 2% | 2% |
| Plasticizer | Polyöl 130 | 15% | 15% | 15% | 15% | 15% | 15% | 12.5% | 10% | 0% | 0% |
| | Nisso PB B-1000 | 15% | 15% | 15% | 15% | 15% | 15% | 12.5% | 10% | 30% | 25% |
| Additives | | 1% | 1% | 1% | 1% | 1% | 1% | 1% | 1% | 1% | 1% |
| Measured values | Hardness according to DIN in Shore A | 62.2 | 67.7 | 64.0 | 63.5 | 65.5 | 67.4 | 69.3 | 72.6 | 65 | 73.5 |
| | Anisotropy factor | 1.0 | 4.2 | 2.7 | 1.0 | 1.1 | 1.0 | 1.3 | 2.0 | 1.0 | 1.5 |
| | Raw layer plasticity (1 min) in % | 10.7 | 8.7 | 9.3 | 14 | 25 | 48 | 11.9 | 10.7 | 13 | 11.2 |
| | MVR at 100° C. in cm$^3$/10 min | 9.7 | 9.2 | 7.1 | 13.7 | 16.3 | >25 | 8.8 | 4.9 | 10.5 | 7.3 |

TABLE 2

Formulation of the photopolymerizable layer of Examples 1 to 4 and Comparative Example C4 (data in % by weight) and measured values obtained: melt flow index and raw layer plasticity of the photopolymerizable flexographic printing element; hardness and anisotropy factor of the finished flexographic printing plate

| | Component | C4 | Example 1 | Example 2 | Example 3 | Example 4 |
|---|---|---|---|---|---|---|
| Binder | Kraton D-1102 | 57% | 57% | 52% | 57% | 52% |
| | Kraton D-1192 | | | | | |
| | Kraton D-1101 | | | | | |
| Monomer | Hexanediol diacrylate | 10% | 2% | 2% | 2% | 2% |
| | Tricyclodecanedimethanol diacrylate | | 8% | 13% | 8% | 13% |
| Initiator | Benzyl dimethyl ketal | 2% | 2% | 2% | 2% | 2% |
| Plasticizer | Polyöl 130 | 15% | 15% | 15% | 0% | 0% |
| | Nisso PB B-1000 | 15% | 15% | 15% | 30% | 30% |
| Additives | | 1% | 1% | 1% | 1% | 1% |
| Measured values | Hardness (DIN) in ° Shore A | 63.5 | 68.1 | 75.1 | 72 | 79.3 |
| | Anisotropy factor | 1.0 | 1.0 | 1.0 | 1.0 | 1.0 |
| | Raw layer plasticity (1 min) | 14 | 9.9 | 14.7 | 9.8 | 14.3 |
| | MVR (at 100° C.) in cm$^3$/10 min | 13.7 | 9.9 | 17.7 | 12.2 | 16.2 |

The results in Table 2 show that the relief-forming layers produced in Examples 1 to 4 are substantially harder compared with the layer of Comparative Example C1. The plates produced are anisotropy-free and show an acceptable raw layer plasticity. Owing to a melt flow index of >5 cm$^3$/10 min, the photopolymerizable layers have round processability according to the process described in WO2004/092841.

In contrast, formulations comprising a binder having a higher styrene content (C2-C3; see Table 1) lead to hard photopolymerized layers, but, owing to their anisotropic behaviour, these cannot be used.

If an attempt is made to realize the hardness of the photopolymerized layers by a higher monomer content (C4 to C6, Table 1), the raw layer plasticity of the plate increases disproportionately with increasing proportion of monomer. A monomer content of 10% by weight leads, with a raw layer plasticity of 14%, to a raw layer plasticity which is still just acceptable, but the hardness of this photopolymerized layer is only insignificantly higher at 63.5° Shore A. At higher monomer contents, the raw layer plasticity and hence the cold flow of the unexposed photopolymerizable layer become too great. In total, no formulation for significantly harder layers results from these experiments.

Attempts to achieve a harder plate by reducing the plasticizer content (C7 to C10, Table 1) lead to harder photopolymerized layers, but these are anisotropic even with a small reduction of the plasticizer content. The use of a plasticizer having a high content of vinyl groups leads to a somewhat harder photopolymerized layer but a reduction in the proportion of this plasticizer also leads to an anisotropic layer here. In total, no formulation for significantly harder layers results from these experiments.

Printing Tests

Comparative Example C11

The photopolymerizable layer produced in Comparative Example C4 was processed to give a continuous seamless printing plate, as described in the general method. The adhesion-promoting layer used was the foam adhesive tape Rogers SA 2520 (from Rogers Corporation). Proof printing with the printing plate produced was effected on a Primaflex press (from Windmöller & Hölscher).

Examples 5 and 6

The photopolymerizable layers produced in Examples 1 and 3 were processed to give continuous seamless printing plates, as described in the general method. The adhesion-promoting layer used was the foam adhesive tape Rogers SA 2520 (from Rogers Corporation). Proof printing with the printing plates produced was effected on a Primaflex press (from Windmöller & Hölscher).

Results: The print patterns produced during the proof printing (test patterns with tonal value variations) were evaluated, and the results with respect to percent dot area (=full-tone density=measure for the completeness of the transfer of the printing ink to the printed substrate; determination by means of densitometer according to DIN16600), tonal value range and increase in tonal value in the 30% screen are listed in Table 3.

TABLE 3

Results of the printing tests

| Printing test No. | C11 | E5 | E6 |
|---|---|---|---|
| Flexographic printing element used | C4 | Example 1 | Example 3 |
| Hardness (DIN) in ° Shore A | 63.5 | 68.1 | 72 |
| Percent dot area | 1.38 | 1.49 | 1.61 |
| Tonal value range | 3-97% | 1-98% | 1-99% |
| Increase in tonal value in 30% screen | +12.3% | +12.8% | +12.5% |

As can be gathered from Table 3, a comparable, small increase in tonal value was achieved with the printing plates of the Examples (E5 and E6) and of the Comparative Example (C11). With the constant small increase in tonal value, however, the percent dot area according to Examples E5 and E6 is substantially higher. The tonal value range according to Examples E5 and E6 is also higher than that of Comparative Example C11.

Swelling Experiments

For the swelling experiments, in each case 2×2 cm² pieces of the finished relief layer (i.e. of the coated layer) without substrate and substrate sheet were placed in 10 ml of swelling liquid. The swelling time was in each case 60 min. In each case the layer thickness was determined before swelling and after swelling for 60 min. The swelling liquid (1) used was a mixture of ethanol, ethoxypropanol and ethyl acetate (50/45/5). These mixtures are typical solvents which are used in flexographic printing inks. The swelling liquid (2) used was hexanediol diacrylate. This is a typical constituent of UV-curable printing inks. The results are shown in Table 4.

TABLE 4

Results of the swelling experiments (layer thickness before swelling experiment 100%)

| | Relative layer thickness | |
|---|---|---|
| Relief layer according to | C4 | Example 1 |
| Swelling medium | | |
| (1) Ethanol/ethoxypropanol/ethyl acetate (50/45/5) | 103% | 101% |
| (2) Hexanediol diacrylate | 107% | 105% |

The results show that the flexographic printing plate according to the invention and according to Example 1 swells both in swelling medium 1 and in swelling medium 2 to a lesser extent than the flexographic printing plate according to Comparative Example 4.

The invention claimed is:

1. A photopolymerizable flexographic printing element for producing hard flexographic printing plates comprising
 a dimensionally stable substrate; and
 a photopolymerizable, relief-forming layer comprising, based in each case on the total amount of all components of said photopolymerizable, relief-forming layer,
  40 to 90% by weight of a binder comprising at least one thermoplastic elastomeric block copolymer which comprises at least one block formed from an alkenyl aromatic and at least one block formed from a 1,3-diene;
  0.1 to 20% by weight of at least one ethylentically unsaturated monomer M;
  0.1 to 5% by weight of a photoinitiator; and
  1 to 40% by weight of a plasticizer;
 wherein monomer M comprises at least one di(meth)acrylate M1 of formula
  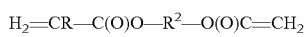
 wherein
  R is H or a methyl group; and
  $R^2$ is a divalent alicyclic hydrocarbon radical comprising 10 to 20 carbon atoms, and
 wherein said photopolymerizable, relief-forming layer, after exposure and photopolymerization, has a hardness of at least 66° Shore A.

2. The photopolymerizable flexographic printing element of claim 1, wherein said photopolymerizable, relief-forming layer, after exposure and photopolymerization, has an anisotropy factor of not more than 1.2.

3. The photopolymerizable flexographic printing element of claim 1, wherein said at least one di(meth)acrylate M1 comprises tricyclodecanedimethanol di(meth)acrylate.

4. The photopolymerizable flexographic printing element of claim 1, wherein said photopolymerizable, relief-forming layer comprises from 2 to 15% by weight of said at least one di(meth)acrylate M1.

5. The photopolymerizable flexographic printing element of claim 1, wherein said photopolymerizable, relief-forming layer comprises further monomers M2, wherein the weight ratio of monomers M1:M2 is at least 1:1.

6. The photopolymerizable flexographic printing element of claim 1, wherein said at least one thermoplastic elastomeric block copolymer comprises a styrene-butadiene block copolymer.

7. The photopolymerizable flexographic printing element of claim 1, wherein said at least one thermoplastic elastomeric block copolymer comprises a styrene-isoprene block copolymer.

8. The photopolymerizable flexographic printing element of claim 1, wherein said photopolymerizable, relief-forming layer, before exposure, has a raw layer plasticity in the range of from 5 to 16%.

9. The photopolymerizable flexographic printing element of claim 1, wherein said photopolymerizable, relief-forming layer, before exposure, has a melt flow index, at 100° C. and with an applied weight of 5 kg, in the range of from 5 to 50 cm³/10 min.

10. A process for producing the photopolymerizable flexographic printing element of claim 1 comprising
 I thoroughly mixing the components of said photopolymerizable, relief-forming layer in an extruder with heating to give a molten photopolymerizable material;
 II discharging said molten photopolymerizable material through a slot die between a (1) substrate sheet optionally coated with an elastomeric substrate layer and a (2) cover sheet to give a layer composite; and
 III calendering said layer composite.

11. A photopolymerizable, cylindrical, continuous seamless flexographic printing element, comprising a hollow cylinder, an adhesion promoting layer on the hollow cylinder, optionally an elastomeric substrate layer, and a photopolymerizable relief-forming layer comprising, based in each case on the total amount of all components of said photopolymerizable, relief-forming layer,

- 40 to 90% by weight of a binder comprising at least one thermoplastic elastomeric block copolymer which comprises at least one block formed from an alkenyl aromatic and at least one block formed from a 1,3-diene;
- 0.1 to 20% by weight of an ethylenically unsaturated monomer M;
- 0.1 to 5% by weight of a photoinitiator; and
- 1 to 40% by weight of a plasticizer;
- wherein monomer M comprises at least one di(meth)acrylate M1 of formula $$H_2{=}CR{-}C(O)O{-}R^2{-}O(O)C{=}CH_2$$

wherein

R is H or a methyl group; and $R^2$ is a divalent alicyclic hydrocarbon radical comprising 10 to 20 carbon atoms, and wherein said photopolymerizable, relief-forming layer, after exposure and photopolymerization, has a hardness of at least 66° Shore A.

12. A process for producing the photopolymerizable, cylindrical, continuous seamless flexographic printing element of claim 11, comprising
a) providing a layer composite comprising a peelable temporary substrate sheet, optionally an elastomeric substrate layer, a photopolymerizable, relief-forming layer comprising, based in each case on the total amount of all components of said photopolymerizable, relief-forming layer,
- 40 to 90% by weight of a binder comprising at least one thermoplastic elastomeric block copolymer which comprises at least one block formed from an alkenyl aromatic and at least one block formed from a 1,3-diene;
- 0.1 to 20% by weight of an ethylenically unsaturated monomer M;
- 0.1 to 5% by weight of a photoinitiator; and
- 1 to 40% by weight of a plasticizer;
- wherein monomer M comprises at least one di(meth)acrylate M1 of formula $$H_2{=}CR{-}C(O)O{-}R^2{-}O(O)C{=}CH_2$$

wherein

R is H or a methyl group; and $R^2$ is a divalent alicyclic hydrocarbon radical comprising 10 to 20 carbon atoms, and wherein said photopolymerizable, relief-forming layer, after exposure and photopolymerization, has a hardness of at least 66° Shore A; and a peelable temporary cover sheet;
b) cutting to size the edges of said layer composite which are to be joined;
c) pushing on and locking a hollow cylinder on a rotatably mounted support cylinder;
d) applying an adhesion-promoting layer to the outer surface of said hollow cylinder;
e) applying said layer composite cut to size to said hollow cylinder to which said adhesion-promoting layer has been applied after peeling off said peelable temporary substrate sheet from the photopolymerizable relief-forming layer or the elastomeric substrate sheet;
f) peeling off said peelable temporary cover sheet from said photopolymerizable relief-forming layer;
g) joining said cut edges at a temperature below the melting point of said photopolymerizable relief-forming layer by bringing the surface of said photopolymerizable relief-forming layer on the hollow cylinder into contact with a rotating calender roll until the cut edges are joined to one another; and
h) removing the processed hollow cylinder from the support cylinder.

13. The process of claim 12, wherein said adhesion-promoting layer is a double-sided adhesive tape.

14. The process of claim 12, further comprising
i) (1) imagewise exposing said photopolymerizable relief-forming layer and developing said exposed photopolymerizable relief-forming layer or (2) uniform exposing said photopolymerizable, relief-forming layer and engraving a print relief into said exposed photopolymerizable relief-forming layer by means of a laser.

15. A layer composite for producing a photopolymerizable, cylindrical, continuous seamless flexographic printing element, comprising a peelable temporary substrate sheet, optionally an elastomeric substrate layer, a photopolymerizable, relief-forming layer comprising, based in each case on the total amount of all components of said photopolymerizable, relief-forming layer,
- 40 to 90% by weight of a binder comprising at least one thermoplastic elastomeric block copolymer which comprises at least one block formed from an alkenyl aromatic and at least one block formed from a 1,3-diene;
- 0.1 to 20% by weight of an ethylenically unsaturated monomer M;
- 0.1 to 5% by weight of a photoinitiator; and
- 1 to 40% by weight of a plasticizer;
- wherein monomer M comprises at least one di(meth)acrylate M1 of formula $$H_2{=}CR{-}C(O)O{-}R^2{-}O(O)C{=}CH_2$$

wherein

R is H or a methyl group; and $R^2$ is a divalent alicyclic hydrocarbon radical comprising 10 to 20 carbon atoms, and wherein said photopolymerizable, relief-forming layer, after exposure and photopolymerization, has a hardness of at least 66° Shore A; and a peelable temporary cover sheet.

16. A process for producing the layer composite of claim 15 comprising
I thoroughly mixing the components of said photopolymerizable, relief-forming layer in an extruder with heating to give a molten photopolymerizable material;
II discharging said molten photopolymerizable material through a slot die between a (1) substrate sheet optionally coated with an elastomeric substrate layer and a (2) cover sheet to give a layer composite; and
III calendering said layer composite.

* * * * *